United States Patent [19]

Tonnel et al.

[11] 4,143,421

[45] Mar. 6, 1979

[54] TETRODE TRANSISTOR MEMORY LOGIC CELL

[75] Inventors: Eugene Tonnel; Maurice Depey, both of Paris, France

[73] Assignee: Thomson-CSF, Paris, France

[21] Appl. No.: 831,049

[22] Filed: Sep. 6, 1977

[30] Foreign Application Priority Data

Sep. 10, 1976 [FR] France .................................. 76 27291

[51] Int. Cl.$^2$ .............................................. G11C 11/40
[52] U.S. Cl. ..................................... 365/180; 365/177; 307/238; 307/304; 357/43
[58] Field of Search ................ 365/180, 177; 307/238, 307/279

[56] References Cited

U.S. PATENT DOCUMENTS

| | | | |
|---|---|---|---|
| 3,918,033 | 11/1975 | Case et al. | 365/180 |
| 3,986,177 | 10/1976 | Picquendor | 365/180 |

Primary Examiner—Terrell W. Fears
Attorney, Agent, or Firm—Cushman, Darby & Cushman

[57] ABSTRACT

A memory cell, made of a tetrode type bipolar transistor, which has an emitter, a base, a collector, and a grid, insulated by a dielectric layer in which an insulated screen is arranged between the grid and the base, the operation as a memory cell requiring means for the temporary application of electrical quantities between the connections which put the junction in the avalanche state, and between the grid connections, the positive or negative sign chosen for these latter quantities representing one or the other of the writing logic signals, the resulting change in the transistor gain forming the recorded information reading signal.

15 Claims, 12 Drawing Figures

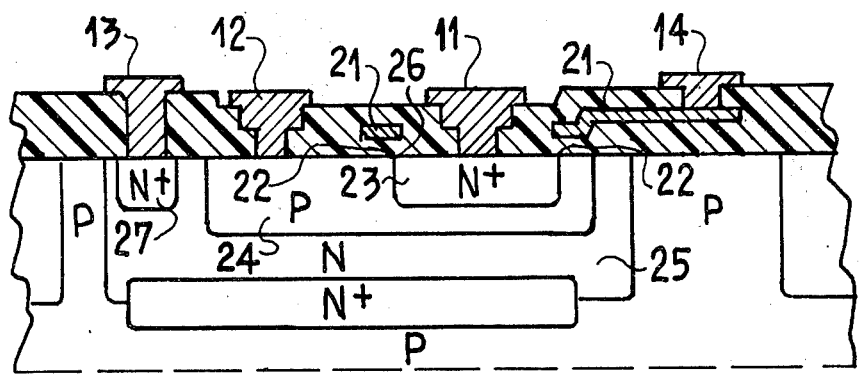
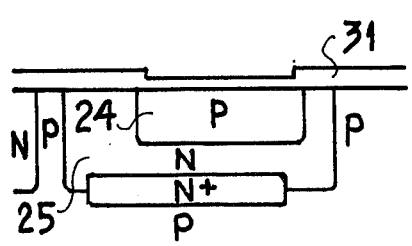
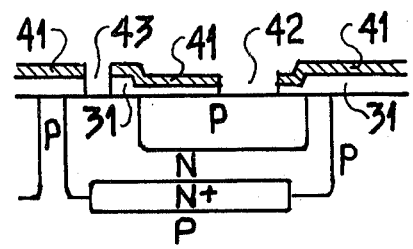
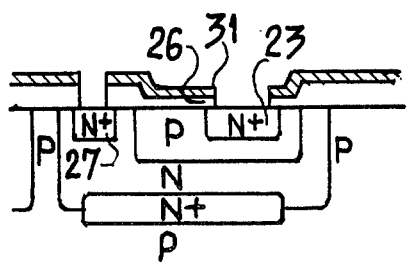
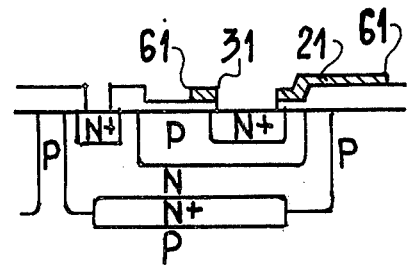

TETRODE TRANSISTOR MEMORY LOGIC CELL

The present invention covers active electronic devices made of semi-conductor materials, and known as "memories". Such circuits, whose methods of manufacture normally use monolithic integration techniques, are formed by a collection of elementary cells each of which is a memory unit. Each has an input or write terminal, for the introductions of data to be recorded, an output or read terminal for the extraction of the data, and electrical energy supply terminals.

The data are usually stored in binary form, the memory unit being in one of two different electrical states depending on which state "0" or "1" the information is in.

Certain types of memory units do not retain their state when the energy supply is cut off: they are called volatile memories. Also, an important parameter in applications is the speed at which the recorded data can be read, or the "read speed".

There are read and write memories whose write operation frequency and speed are of the same order as those of the read operation.

There are also memories for reading only or ROMs (Read Only Memory), whose contents are fixed once and for all during manufacture. There are also read only memories which can be programmed by the user irreversibly (PROMs). Read and write memories (RAMs) are normally volatile; on the other hand ROMs or PROMs are not, i.e. they retain their contents when the power supply is cut off.

Finally, it is necessary in certain applications to have available non-volatile memories which are mainly used in the read mode (RMMs or Read Mostly Memories) and in this respect are similar to ROMs, but it must be possible to change their contents. They are re-recording memories. Generally, their recording speed can be slow compared with their read speed. The present invention covers this last type, i.e. a re-recording memory.

In the case of re-recording memories, the electrical parameter which may have two separate values that are associable with a binary variable, is usually an operating characteristics of a field effect transistor, the threshold voltage for example. This characteristic may be changed permanently but reversibly by using the storage or evacuation of electrical charges, either at the interface of two dielectric layers in the transistor, or on a free potential insulated grid.

The accumulation of charges (writing of a "1") is obtained by the application of electrical voltages and currents; however, the removal of these charges (writing of a "0") requires an exposure to ultra-violet radiation which is a serious disadvantage.

Another known procedure makes it possible to avoid this, and to have re-recording memory units, by using electrical quantities only both for one logic state and for the other.

To do this, in a MOS type field effect transistor (MOSFET) the production of charges with high mobility, normally known as "hot carriers", is used. Intense localized electrical fields are used, for example by bringing a PN junction to the avalanche state. One type or the other of hot carrier, electrons or holes, can be produced and injected in the transistor's insulating layer by acting on additional junctions suitably arranged in the transistor's structure.

However, the cells or memory units formed by MOSFETs have the serious disadvantage of a rather slow state change or switching speed. Hence, the memories which use them have limited reading speed and it was indicated above the advantages in reducing this.

Even though this disadvantage can be reduced by combining, in each memory unit, a MOS transistor, which performs the memory function properly speaking, and a bipolar current amplifier transistor, the result is an unacceptable increase in size in the total surface occupied by the unit and the bipolar transistor in the integrated circuit.

The memory unit which forms the present invention does not have these disadvantages: it is non-volatile, re-records electrically, is fast in the mode and, lastly, of small size.

As a basic constituent of a memory unit, it uses a bipolar type silicon transistor with four electrodes, known technically as a tetrode transistor. Such a transistor, apart from the three electrodes, emitter, base and collector, has a fourth electrode or grid made of conducting material placed near the emitter-base junction from which it is insulated by a semi-conductor oxide layer, a silica layer.

The theory of operation when using such a transistor as a memory unit is based on the fact that, if highly mobile charge carriers exist in the silicon block near its interface with the silica layer, it is possible, by raising the grid to one or the other of two suitable potentials, either to attract them into this oxide layer, where they will be stored or "trapped" permanently, by producing electrostatic effects around them, or to reject them, if they were already there. In the transistor itself it is one of these effects which is used, i.e. their influence on the transistor's current gain, depending on whether they are present or absent.

In accordance with the invention, it is intended to produce these very mobile charge carriers, or "hot carriers", by placing the transistor's emitter-base junction in the "avalanche" state.

In accordance with the invention, it is also intended that the tetrode transistor grid be made of a material in compliance with a special procedure because of the high geometrical precision required when implanting this electrode.

It is also intended, in accordance with the invention, to use a new type of tetrode transistor. In this transistor the storage of "trapping" of free charges occurs on an additional conducting screen electrode at a free potential. This new transistor can be used by itself for any purpose, but it is particularly useful in the case of a memory unit.

Finally, in accordance with the invention, it is intended to use several memory units, connected together in a global memory, to which they give their advantageous individual characterists indicated above, and to give a way of making such a memory in an integrated monolithic form.

More precisely, the present invention concerns a transistor memory logic unit, comprising:

a bipolar tetrode type transistor, fitted with terminals connected respectively to the emitter, base and collector regions, which are separated by junctions coming out on the same face of the transistor, and a grid electrode arranged on the same face opposite the said junctions, which is electrically insulated from the semi-conductor by a layer of dielectric material;

circuits connected to the said terminals including means for applying electrical quantities temporarily to these terminals, which ensure simultaneously the application of a polarizing voltage of one sign or the other to the grid and the setting up of an avalanche condition is one of the said junctions including means for measuring the transistor's amplification, the sign of the polarizing voltage forming the write logic data and the corresponding gain value determining the read logic data.

The invention will be better understood by means of the following description and reference to the attached figures in which:

FIG. 1 shows in section a memory cell in accordance with the invention,

FIGS. 2 to 5 show in section such a cell at different stages of manufacture,

Figure 6:
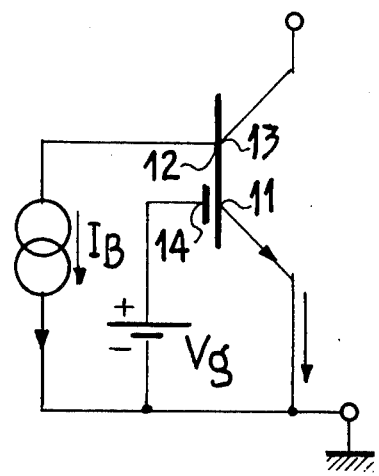
Figure 7:
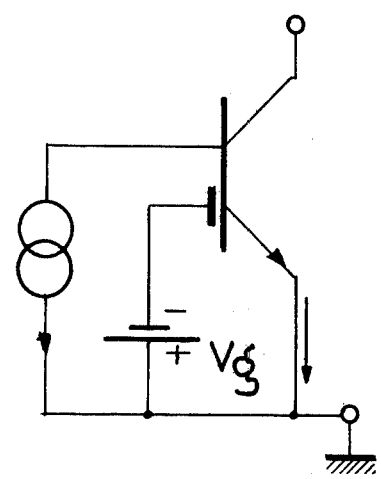
Figure 8:
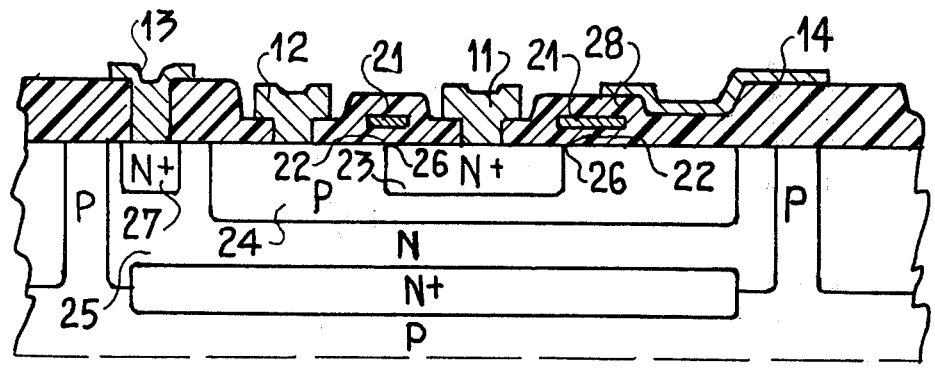
Figure 9:
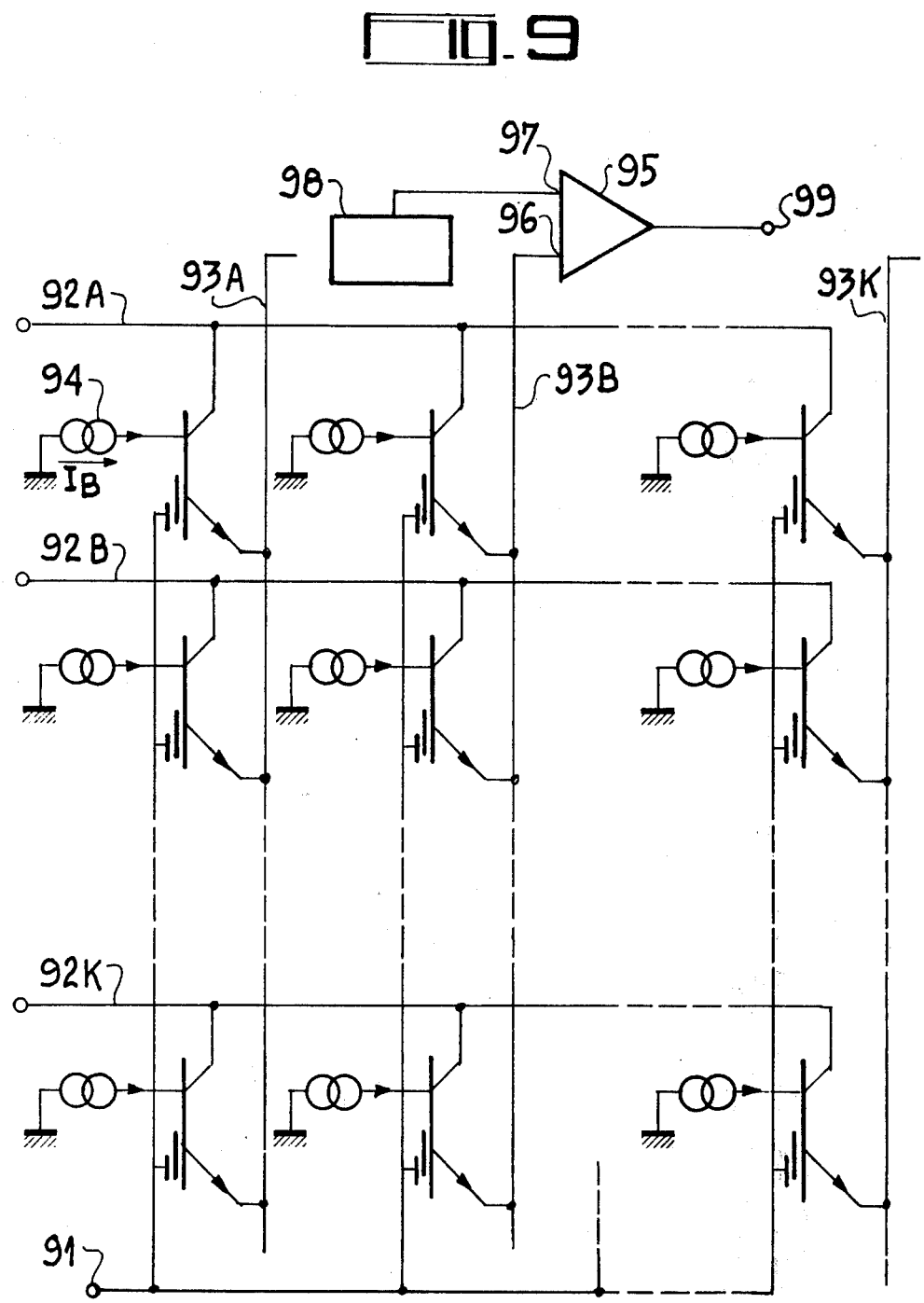
Figure 10:
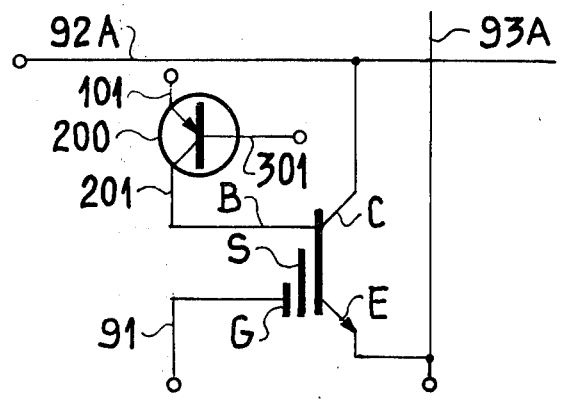
Figure 11:
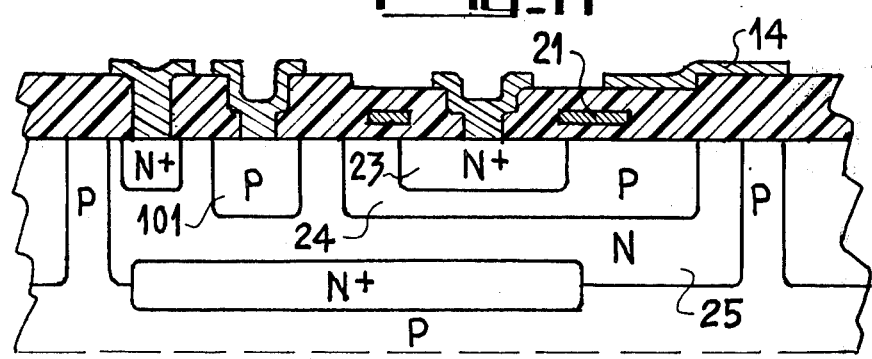

FIGS. 6 and 7 show the electrical conditions to be applied to record a zero or a one, FIG. 8 shows in section a memory cell with a screen in accordance with the invention, FIG. 9 is the theoretical electrical schematic of a memory network formed by a combination of cells such as that in FIG. 1, FIG. 10 shows, in a partial schematic, a variety of the memory network in FIG. 9, FIG. 11 shows in section a monolithic memory network as in FIG. 10.

Figure 12:
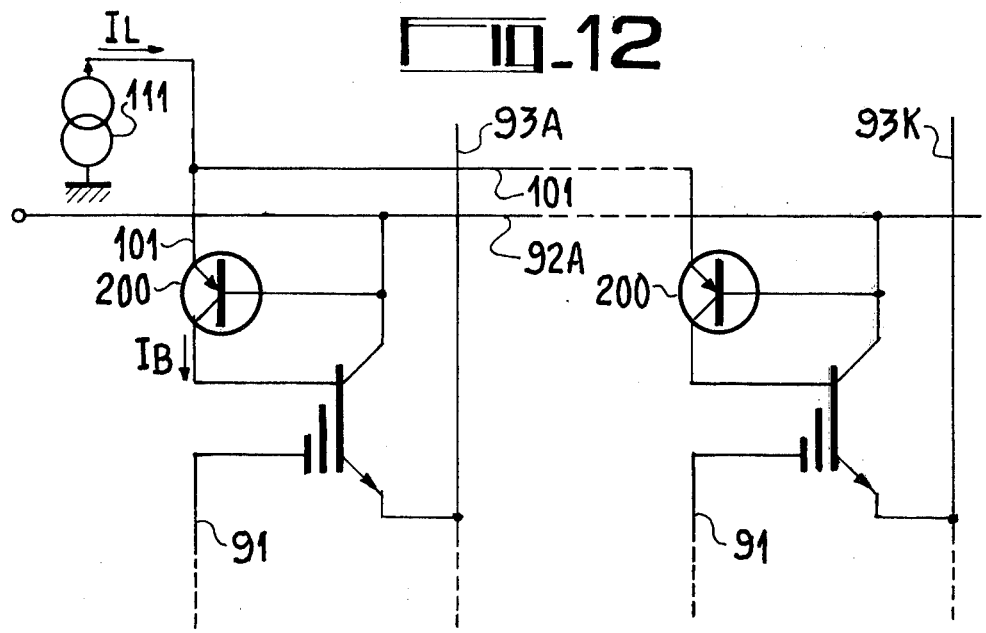

FIG. 12 shows a memory circuit containing PNP transistor current sources.

FIG. 1 shows an integrated tetrode transistor in accordance with the invention. In its general structure, it is a bipolar NPN transistor of a known type, fitted with a fourth electrode 21 which, in all that follows, will be called the grid. The grid is made of a material adapted to its precise manufacture.

In this transistor, the emitter, base and collector are formed by the regions (N+) 23, (P) 24 and (N) 25 respectively. The emitter-base junction, which is formed at the edge of regions 23 and 24, meets the silicon surface at 26.

In accordance with the invention, the grid is formed by a layer of polycrystalline silicon 21, which is insulated by an oxide layer 22 from the various subjacent P or N silicon zones. This grid 21 must cover, at least in part, the region 26 in which the emitter-base junction meets the surface of the silicon sheet.

Electrical contact with the emitter 23, base 24, collector 25 and grid 21 regions is provided by thin metallic layers, made of aluminium for example, arranged respectively at 11, 12, 13 and 14.

FIGS. 2 to 5 show, in section, stages in a preferred way of manufacturing the structure in accordance with the invention.

FIG. 2 shows the state of the structure, after the first stages of manufacture, on a substrate P, of an integrated NPN transistor, i.e. the state ot the wafer after diffusion of the base.

FIG. 3 shows a state characteristic of the manufacture, that of grid 14: at this stage, a uniform layer of polycrystalline silicon 41 is deposited, and then it is engraved locally, using a mask which fixes the positions of the future N+ zones of emitter 42 and of collector contact 43. Then the oxide 31 is engraved in this position, using the polycrystalline silicon to protect the oxide zones that are to be retained.

FIG. 4 shows a later stage, i.e. the production by diffusion of the N+ zone of emitter 23 and of collector contact 27. Thanks to lateral diffusion, part 26 of the emitter-base junction which meets the monocrystalline silicon surface is thus auto-positioned with respect to edge 31 of the grid. Hence, it possesses an essential characteristic of the invention.

FIG. 5 shows the next stage, the engraving of the polycrystalline layer 21, which is done using a suitable photomask, to define the external contour 61 of the grid's final layout, of a general ring form.

To obtain the final structure of FIG. 1, the connections by metal layers have to be made in accordance with the following stages, which are not shown, i.e. the production of a silicon oxide insulating layer by oxidation, which makes it possible to cover with oxide the exposed monocrystalline silicon, for the diffusion of the emitter on the one hand, and the polycrystalline silicon forming the grid on the other; the opening up of contact zones by means of localized engraving using a suitable photomask, which also makes it possible to reach the grid zone locally; the deposition of conductor metal such as aluminum; and finally engraving of this metal to fix the interconnection contours.

FIGS. 6 and 7 show two explanatory schematics of the conditions under which the electrical quantities are to be applied to the transistor to write a zero or a one.

A characteristic parameter of a transistor is its current amplification under given conditions. The two states 0 and 1 are represented by two different values of this gain in the present invention. This gain will be identified by the letter B in what follows, in the case in which the transistor assembly is said to be "with emitter common", and the gain is measured for zero grid-emitter voltage (or a constant low value) and a low emitter current. Let $B_o$ be the initial value of B.

The change of state occurs as follows: in compliance with FIG. 6, for a certain time, 1 second for example, a current, 10 mA for example, on the one hand, is applied in the emitter-base junction in a direction such that it switches to the avalanche condition; and a voltage $V_g$, 50 Volts for example, on the other, is applied simultaneously between grid and base, or between grid and emitter, such that the grid polarity is positive. The trapping of hot carriers, as was explained above, then takes place in the silica layer and, when the double application of current and voltage is removed, a new gain B, whose value $B_d$ is less than $B_o$, is obtained, the ratio $B_o/B_d$ being about 10. The new value $B_d$ may be considered as corresponding to the writing of a zero, (0). Under normal conditions of transistor use, the value $B_d$ of the decreased gain is retained, as long as new constraints of emitter-base avalanche and grid voltage are not applied, and as long as the temperature remains less than a certain value, about 150°.

If, on the other hand, the same constraints as before are applied, but with the grid polarity $V_g$ reversed as in FIG. 7, when the double constraint is removed, a new value of B, $B_r$ say, is obtained, which is very close to $B_o$ before it was reduced. This value $B_r$ corresponds to the writing of a one (1).

Under normal conditions of transistor use, the value of the gain thus restored is retained until a new reduction constraint is applied. The transistor current gain can therefore be placed as desired, and by purely electrical means, either within a range of high values or within a range of low values. Hence the transistor can store a binary item of information which is not erased when the transistor is not being fed.

This tetrode transistor used with the preceding means can therefore form a re-recording, non-volatile memory unit.

FIG. 8 shows a bipolar type tetrode transistor with a new structure very well adapted for operation as a memory unit. It has an additional conducting electrode, fitted between the grid and the emitter-base junction, which acts as a screen between these two elements.

Also, this screen is not connected to an electrical energy source. Its electrical potential is mainly tied to that of the control grid already present in the known bipolar type of tetrode transistor.

The structure of the screen tetrode transistor is clearly visible in FIG. 8.

On the figure, the screen whose potential is not fixed or is "floating", which, for reasons of simplicity in all that follows, will be called the "floating screen", bears the identity number 21 and is fitted between the emitter-base junction 26 and the control grid 44. As has been said, the floating screen is not connected electrically to any of the device's terminals.

In accordance with the structure described above, the emitter, base and collector of the NPN transistor are formed respectively by $N^+$ type area 23, the P type area 24 and the N type area 25 as shown in FIG. 2. The emitter-base junction formed at the limits of the areas 23 and 24 meets the silicon surface at 26.

In the same way, a conducting layer 21, of polycrystalline silicon for example, is arranged above a part at least of the perimeter 26 of the emitter-base junction and forms the floating screen. This floating screen is completely insulated from the various subjacent silicon areas by an oxide layer 22 which has to be crossed by the hot carriers produced when there is an avalanche at this junction. Oxide layer 22 has to be sufficiently thin underneath also to allow the charges accumulated in screen 21 to act at a distance, and influence the transistor emitter-base characteristic when the transistor is operating in the normal active mode.

Also in accordance with the invention, control grid 14 covers partly the floating screen from which it is separated by an insulating layer 28, made, for example, of silica $SiO_2$. Control grid 14 is of conducting material, aluminium for example. This control grid can be made at the same stage in manufacture as the access connections for the emitter, base and collector described when dealing with the structure shown in FIG. 1.

The interesting part of the improved tetrode transistor shown in FIG. 8 is the increase in the writing speed obtained by the presence of the floating screen when the transistor is used as a memory unit.

The writting speed of such a memory unit depends on the ratio between the total avalanche current produced, and the electrical charges effectively "trapped" in the silica layer. In the tetrode transistor of known type, the control grid receives part of the hot carriers which are thrown on it. They flow away in its connection and are lost for trapping. In the case of the floating screen tetrode transistor, however, it is the screen which, by its position, recovers most of the hot carriers from the avalanche and they act, like those which are trapped in the oxide level, on the emitter-base junction. The screen retains all the useful charges, since it is not connected to anything and this increases the writing speed.

It may be noted that it is not essential that all the floating screen surface be covered by the control grid. It should be arranged that the effect of the control grid potential on this screen's potential be as big as possible compared with the parasitical influence of the potential of other connections and, in particular, that of the emitter, which is near the screen. In other words, the capacity between the emitter connection and the screen is to be low compared with the capacity between the control grid and the screen.

In particular, therefore, crossings between the floating screen and the emitter connection must be avoided. This results in interrupting this screen above part of the emitter-base junction periphery over the emitter connection passage.

The preceding description concerns an NPN type transistor but it is to be understood that the invention also applies to a PNP transistor, whether it be vertical ar lateral, the essential being in all cases that the emitter-base junction can, by avalanche, inject, through the oxide, on a floating screen, charges whose polarity is fixed by the potential applied to the control grid, and that, as a function of the polarity of the charges thus accumulated, the transistor's gain B is then big or small.

FIG. 9 shows a way of using the memory cell of the invention to produce a memory circuit containing several such cells connected together in an arrangement of lines and columns normally known under the name of memory "matrix".

Although this circuit may be formed of tetrode transistors of the type described in the first part of the present text i.e. transistors with an emitter, a base, a collector and a control grid, the memory circuit whose description follows is formed of tetrode transistors improved in accordance with the present invention, of the type described in the second part and containing a floating screen.

In the matrix in accordance with the invention, which has N lines and N columns, all the grids are connected to the same writing control terminal 91. Collectors in the same line are connected together to form a line of "words" 92. Emitters in the same column are connected together to form a column of "bits" 93. The lines and columns have been identified by the letters A, B, ... K, to express their character of an unlimited number. The base of each transistor is fed by a current source 94.

A memory circuit containing such a matrix functions as follows:

In the writing mode, a positive voltage is applied to the writing control terminal 91 to record a 0 (reduction of the current gain), or a negative voltage to record a 1 (restoration of the current gain). An emitter-base avalanche regime is selectively imposed on the particular transistor in which writing is required, by applying simultaneously a high voltage to the emitter column to which the transistor belongs, and a low voltage to the collector line to which the transistor belongs. The lines which are not selected are held at a high voltage or connected to ground by a high impedance; the emitter columns which are not selected have a low voltage applied to them, i.e. less than the avalanche voltage of the emitter-base diodes which is about 6 volts. In the transistor in which writing is occurring, the emitter-base junction avalanche current leaves the transistor through the collector-base junction which is thus directly polarized.

In the reading mode, a few volts are applied to the collector line selected, while the other lines are held at a low voltage. The selected transistor then operates in its normal active zone with a gain B, and passes in the selected column a current of $B \times I_B$. The current in the column selected is then a reflection of the low or high value of B in the transistor selected, while the other transistors in the same column have electrical conditions applied to their collectors which prevent them operating as amplifiers of the base current $I_B$.

Finally, the extraction of the state "0" or "1" data is obtained by comparison of the current in the selected emitter column with a reference current. One of the comparison modes may be conveniently employed by using a comparator circuit 95, the current from the transistor selected being applied to one of its inputs 96 and a fixed reference current delivered by the source 98 being applied to the other input 97. The "0" or "1" information is available at the comparator circuit output terminal 99.

FIG. 10 shows another way of making the current source 94. This current source may be a resistor between the base of the tetrode transistor to be fed and a source supplying a few volts, the voltage source for the whole memory circuit for example. However, it is very useful to use a PNP transistor 200 whose collector 201 is connected to the base of the tetrode transistor to be fed; the normal way of producing memory circuits being monolithic integration in solid state, it is more difficult to obtain a resistor than a transistor.

In this use, it is necessary to fix the electrical supply quantities for the PNP transistor, which are present on the emitter 101 and base 301 terminals, by connecting the latter to fixed power supply sources. A simple common method used for the base consists in connecting it to the same source as that which feeds the collector of the main NPN transistor. This method of connection simplifies the monolithic integration problems as is shown in the next figure.

FIG. 11 shows a preferred way of making the PNP transistor which forms the constant current source, a way which uses the supply arrangement explained above. By thus reducing the surface taken up on the chip, it has been possible with advantage to combine the current source PNP transistor and the tetrode NPN transistor by making the PNP transistor base and the NPN transistor collector in the same N zone 25 on the one hand, and the PNP transistor collector and the NPN transistor base in the same P region 24, on the other.

Under these conditions, region 23 forms the emitter of the main transistor; region 24 forms both the base of this transistor and the collector of the source transistor; region 25 forms both the collector of the main transistor and the base of the source transistor; finally, region 101 forms the emitter of the latter transistor. Thus, with respect to the main transistor only, the making of a two-transistor assembly leads to the production of a single additional region 101.

FIG. 12 shows, in the form of a schematic diagram, a memory circuit containing such PNP transistor current sources. To control the voltage in line 92 A while leaving the current $I_B$ constant, it is sufficient to supply the emitter 101 of the PNP transistor, which is made common to a whole line, from a current source 111 that supplies a current $I_L$ which distributes itself equally between all the bases of the NPN tetrode transistors in the line.

This connection of all the emitters 101, common to a whole line, can be used with advantage in practical manufacture by monolithic integration, the same P zone 101 being continuous in FIG. 11.

It may be noted that the possibilities of fast writing offered by the use of tetrode transistor cells can be mainly retained in memory circuits if the control circuits, such as the lines 92, are so designed as to reduce to a minimum the voltage changes on the base and emitter of each transistor in the memory matrix when switching from the unselected position to the selected one, and vice versa.

Under these conditions and for the practical cases given as examples, the access times for memory circuit in accordance with the invention were very short, typically of the order of a few tens of nanoseconds only.

Of course the invention is not limited to the embodiment described and shown which was given solely by way of example.

What is claimed:

1. A tetrode transistor memory logic cell, comprising:
   a bipolar tetrode type transistor, fitted with terminals connected respectively to the emitter, base and collector regions, which are separated by junctions brought out on the same face of the transistor, and a grid electrode arranged on the same face opposite the said junctions and electrically insulated from the semi-conductor by a layer of dielectric material;
   circuits connected to the said terminals, including means for applying electrical quantities temporarily to the said terminals, which ensure simultaneously the application of a polarizing voltage of one sign or the other to the grid, and the setting up of an avalanche condition in one of the said junctions, and means for measuring the transistor current amplification value, the polarizing voltage sign forming the writing logic information, and the corresponding gain value determining the reading logic information.

2. A memory logic cell as in claim 1, wherein the said grid electrode is formed of polycrystalline silicon.

3. A memory logic cell as in claim 1, wherein the said transistor has a screen electrode arranged between the grid electrode and the said transistor face, the screen electrode being electrically insulated by the said layer of dielectric material.

4. A memory logic cell as in claim 3, wherein the said screen electrode is formed of polycrystalline silicon.

5. A memory logis cell as in claim 1, comprising a constant current source for polarizing the base, the said source being formed by a bipolar transistor of complementary type.

6. A memory logic cell as in claim 5, wherein the said complementary type bipolar transistor is connected by its base to the tetrode transistor's collector, by its collector to the same transistor's base, and by its emitter to a constant current source.

7. A memory logic cell as in claim 6, wherein the tetrode transistor and the complementary type transistor are made by monolithic integration, the emitter region of the second being included in the collector region of the first and their common junction coming out on the same face of the latter.

8. A memory logic cell as in claim 1, wherein the said means for measuring the tetrode transistor amplification value are formed by a comparator circuit with two input terminals, and an output terminal.

9. A memory circuit, comprising a plurality of memory logic cells as in claim 1.

10. A memory circuit as in claim 9, made in a single semi-conductor block by monolithic integration, the said plurality of logic cells being arranged in a network of lines and columns in which, for the tetrode transistors, all the emitters are connected to one of the columns on the one hand and all the collectors are connected to one of the lines on the other, all the grid electrodes being connected together.

11. A memory circuit as in claim 10, wherein the said connection joining all the collectors is formed by the common collector region of the semi-conductor block.

12. A memory circuit as in claim 11, wherein all the emitters of the complementary transistors are joined together by another connection.

13. A memory circuit as in claim 12, wherein the other connection mentioned is formed by the emitter region, which is common to the complementary transistors, of the semi-conductor block.

14. A method for operating a memory circuit as in claim 10, wherein the means for temporarily applying electrical quantities, and the measurement means, ensure the reading of logic data recorded in a given cell at the intersection of a line and a column, the first means by the application to the line of collectors it occupies, of a high electrical voltage with respect to the voltage in the other lines, and the second means by the measurement of the amplification current value delivered by the said connection joining the column of emitters it occupies.

15. A method for operating a memory logic cell as in claim 8, wherein one of said two input terminals receives the said transistor's output signal, and the other a fixed reference signal, the reading logic information being delivered at said output terminal.

* * * * *